United States Patent
Sumi

(10) Patent No.: US 9,999,169 B2
(45) Date of Patent: Jun. 12, 2018

(54) COMPONENT MOUNTING METHOD

(71) Applicant: Panasonic Intellectual Property Management Co., Ltd., Osaka (JP)

(72) Inventor: Hideki Sumi, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 236 days.

(21) Appl. No.: 15/017,170

(22) Filed: Feb. 5, 2016

(65) Prior Publication Data

US 2016/0249499 A1    Aug. 25, 2016

(30) Foreign Application Priority Data

Feb. 24, 2015    (JP) .................................. 2015-033534

(51) Int. Cl.
*H05K 3/30*    (2006.01)
*H05K 13/04*   (2006.01)
*H05K 13/08*   (2006.01)

(52) U.S. Cl.
CPC ..... *H05K 13/0413* (2013.01); *H05K 13/0417* (2013.01); *H05K 13/08* (2013.01)

(58) Field of Classification Search
CPC . H05K 13/0413; H05K 13/08; H05K 13/0417
See application file for complete search history.

(56) References Cited

U.S. PATENT DOCUMENTS 4,411,008 A * 10/1983    d'Alayer de Costemore
                         d'Arc .................. G01B 7/04
                                               360/137

FOREIGN PATENT DOCUMENTS

JP    4675703 B2    2/2011

* cited by examiner

*Primary Examiner* — Paul D Kim
(74) *Attorney, Agent, or Firm* — Pearne & Gordon LLP

(57) ABSTRACT

A component mounting method performs suction and holing, by a suction nozzle, of a component fed to a component picking-up position by a tape feeder which feeds by pitch a carrier tape having a pocket in which the component is accommodated, after a predetermined delay time elapses after a pitch feeding timing, and carries and mounts the component on a board. The component mounting method includes imaging a tape position indicating portion at separate two timings after the delay time elapses, and calculating a shift amount between a first and second tape positions respectively obtained at first and second timings of imaging. It is determined whether or not the shift amount calculated is within an allowable range, and when it is determined that the shift amount exceeds the allowable range, the delay time set for the tape feeder is extended or an error is notified.

2 Claims, 11 Drawing Sheets

COMPONENT MOUNTING METHOD

CROSS-REFERENCES TO RELATED APPLICATION(S)

This application is based on and claims priority from Japanese Patent Application No. 2015-33534 filed on Feb. 24, 2015, the entire contents of which are incorporated herein by reference.

BACKGROUND

1. Field of the Invention

The present invention relates to a component mounting method of picking up a component from a tape feeder and of mounting the component on a board.

2. Description of Related Art

In a component mounting apparatus, a component mounting operation in which a suction nozzle provided in a mounting head picks up a component, through vacuum suction, from a carrier tape which is fed by a tape feeder by pitch and carries the component to mount the component on a board is repetitively executed. When the component is picked up from the tape feeder, in some cases, erroneous suction occurs, which means a problem in relation to component suction, such as a suction error by which it is not possible to perform normal suction of the component due to some factors during the component suction operation by the suction nozzle or a recognition error by which the component is abnormally held during component recognition in which it is determined whether or not a component holding state is good after the component suction.

In many cases, the erroneous suction occurs due to a suction position shift at a component picking-up position, that is, a position shift between a pocket for accommodating the component, which is provided in the carrier tape, and a lowered position of the suction nozzle. Therefore, in the related art, it has been proposed that a suction position is frequently corrected based on a position shift amount detected when a component is picked up (for example, refer to Japanese Patent No. 4675703 as Patent Document 1). This enables an occurrence of a machine stop due to erroneous suction to be reduced in frequency such that it is possible to prevent an apparatus operation rate from being lowered.

Patent Document 1: Japanese Patent No. 4675703

SUMMARY

However, including Japanese Patent No. 4675703 described above, in the related art, a problem arises in that it is difficult to prevent an occurrence of the erroneous suction due to instability in change in a stop process during feeding a carrier tape as will be described below. In general, the tape feeder has operation targets of a plurality of types of carrier tapes which are formed of different materials or have different sizes from one another. A drive system for performing tape feeding in the tape feeder and a drive load of the carrier tape which is a target of tape feeding may not necessarily have a good matching relationship, but, in a case where the drive load is excessive, in some cases, it is not possible to cause pitch feeding in the tape feeding operation to be performed, favorably following an operation pattern set in advance. In addition, during the pitch feeding of the carrier tape, since a cover tape is peeled off while being wound in a direction opposite to a tape feeding direction, a force is applied to the carrier tape in the tape feeding direction and thus a stop position is changed during the tape feeding operation in some cases.

As described above, since the tape feeding operation in the tape feeder becomes unstable due to various factors, in some cases, erroneous suction occurs, by which the carrier tape does not completely stop at a timing at which the suction nozzle is lowered and comes into contact with the component and the component picking-up position is not stable such that it is not possible to perform normal suction and holding of the component. In such component mounting method in the related art, there is a problem in that the erroneous suction occurs due to unstable change in a stop process in the pitch feeding of the carrier tape.

Hence, a non-limited object of one or more aspects of the present invention is to provide a component mounting method in which erroneous suction due to an unstable component supply is prevented from occurring such that it is possible to prevent productivity from being lowered.

A first aspect of the present invention provides a component mounting method of performing suction and holing, by a suction nozzle, of a component fed to a component picking-up position by a tape feeder which feeds by pitch a carrier tape having a pocket in which the component is accommodated, after a predetermined delay time elapses after a pitch feeding timing, and carrying and mounting the component on a board, the component mounting method including: a first imaging of imaging a tape position indicating portion for identifying a tape position in a tape feeding direction of the carrier tape at a timing after the delay time elapses; a second imaging of imaging the tape position indicating portion again after the first imaging; a shift amount calculating of calculating a shift amount between a first tape position obtained by an imaging result in the first imaging and a second tape position obtained by an imaging result in the second imaging; a determination of determining whether or not the shift amount calculated in the shift amount calculating is within an allowable range; and a delay time extending of extending the delay time set for the tape feeder in a case where it is determined that the shift amount exceeds the allowable range.

A second aspect of the present invention provides a component mounting method of performing suction and holing, by a suction nozzle, of a component fed to a component picking-up position by a tape feeder which feeds by pitch a carrier tape having a pocket in which the component is accommodated, after a predetermined delay time elapses after a pitch feeding timing, and carrying and mounting the component on a board, the component mounting method including: a first imaging of imaging a tape position indicating portion for identifying a tape position in a tape feeding direction of the carrier tape at a timing after the delay time elapses; a second imaging of imaging the tape position indicating portion again after the first imaging; a shift amount calculating of calculating a shift amount between a first tape position obtained by an imaging result in the first imaging step and a second tape position obtained by an imaging result in the second imaging step; a determination of determining whether or not the shift amount calculated in the shift amount calculating step is within an allowable range; and a notifying of notifying an error in a case where it is determined that the shift amount exceeds the allowable range.

According to the aspects of the present invention, erroneous suction due to an unstable component supply may be prevented from occurring such that it may be possible to prevent productivity from being lowered.

DETAILED DESCRIPTION

Embodiment 1

Figure 1:
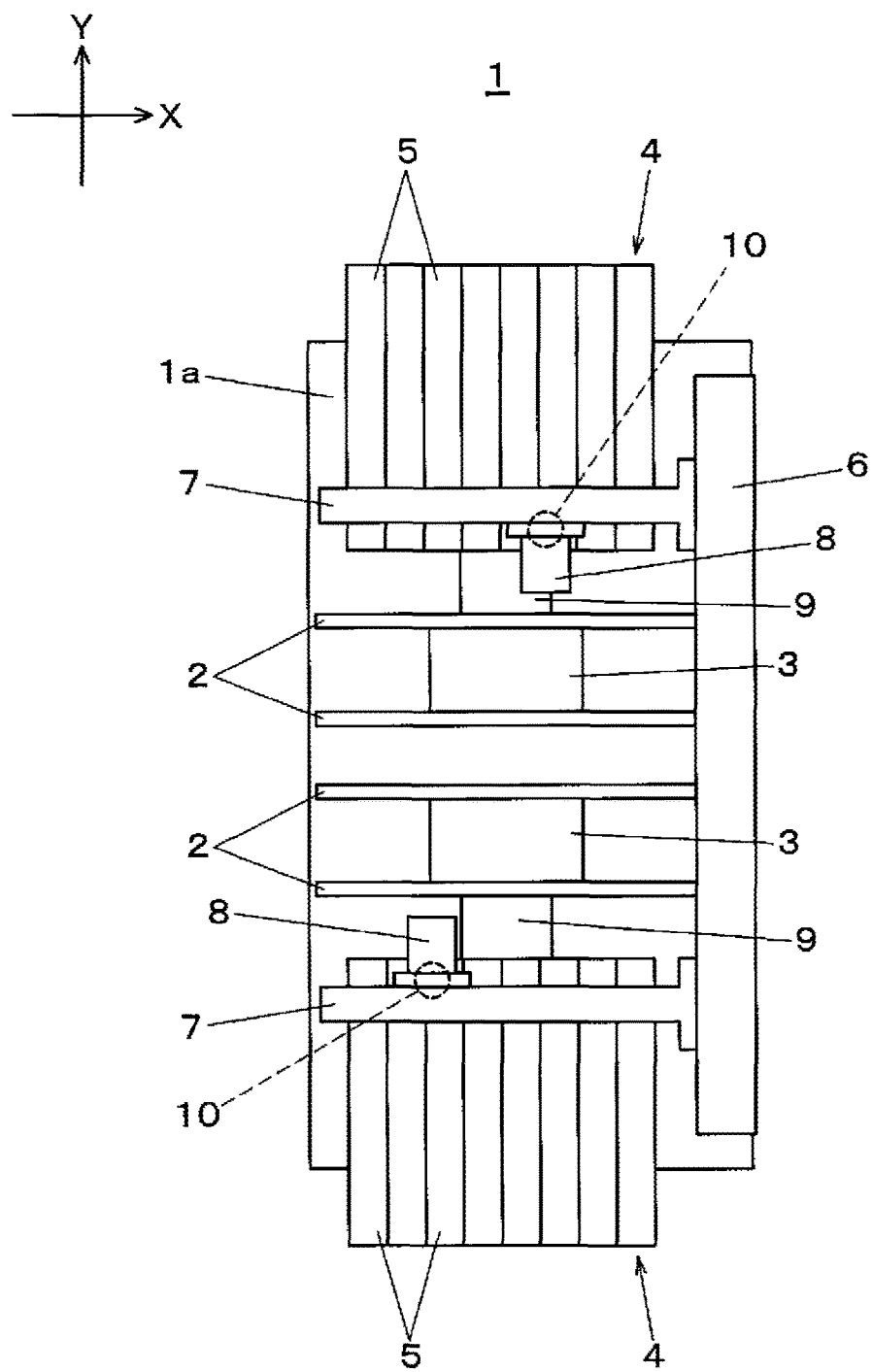
FIG. 1 is a plan view illustrating a component mounting apparatus of an embodiment of the present invention.

First, a configuration of a component mounting apparatus 1 will be described with reference to FIG. 1. Two rows of board transport mechanisms 2 are disposed at the center of a base 1a. The board transport mechanism 2 transports a board 3 in an X direction and positions the board 3 at a component mounting operation position. Component supply units 4 in which tape feeders 5 are provided in parallel with each other, are disposed on both sides of the board transport mechanisms 2. The tape feeder 5 feeds by pitch a carrier tape having a pocket in which a component is accommodated and thereby a component mounting mechanism to be described below supplies a component to a component picking-up position.

A Y-axis traveling beam 6 which includes a linear drive mechanism is provided on one end portion in the X direction of an upper surface of a base 1a and two X-axis traveling beams 7 which include linear drive mechanisms are joined to the Y-axis traveling beam 6. Mounting heads 8 which have suction nozzles 8a (refer to FIG. 2) on lower end portions thereof are mounted on the two X-axis traveling beams 7, respectively. The Y-axis traveling beam 6, the X-axis traveling beams 7, and the mounting heads 8 configure a component mounting mechanism 11 (refer to FIG. 5), driving of the component mounting mechanism 11 causes two mounting heads 8 to move in a horizontal direction. In this manner, the mounting head 8 performs suction and holding of a component P (refer to FIG. 2) by the suction nozzle 8a to pick up the component P fed to the component picking-up position in the tape feeder 5 and carries and mounts the component P on the board 3 positioned by the board transport mechanism 2.

A component-recognition camera 9 is disposed between the component supply unit 4 and the board transport mechanism 2. The component-recognition camera 9 images the component P held by the suction nozzle 8a when the mounting head 8 which picks up the component P moves above the component-recognition camera 9. A board-recognition camera 10 which is positioned on an under surface side of the X-axis traveling beam 7 and moves integrally to the mounting head 8 is mounted in the mounting head 8. The mounting head 8 is caused to travel above the board 3 held by the board transport mechanism 2 and thereby the board-recognition camera 10 images a position recognition mark of the board 3. In addition, the mounting head 8 is caused to travel above the tape feeder 5 of the component supply unit 4, and thereby the board-recognition camera 10 is positioned above the component picking-up position 5a (refer to FIG. 4A) of the tape feeder 5 and images the vicinity of the component picking-up position 5a.

An imaging result of the component-recognition camera 9 is subjected to a recognition process by a recognition processing unit 33 (refer to FIG. 5) and thereby a position of the component P in a state of being held by the mounting head 8 is detected. An imaging result of the board-recognition camera 10 is subjected to a recognition process by a recognition processing unit 33 and thereby position recognition of the board 3 is performed or a position (refer to FIG. 4A) of the tape position indicating portion in the vicinity of the component picking-up position 5a is detected.

Figure 2:
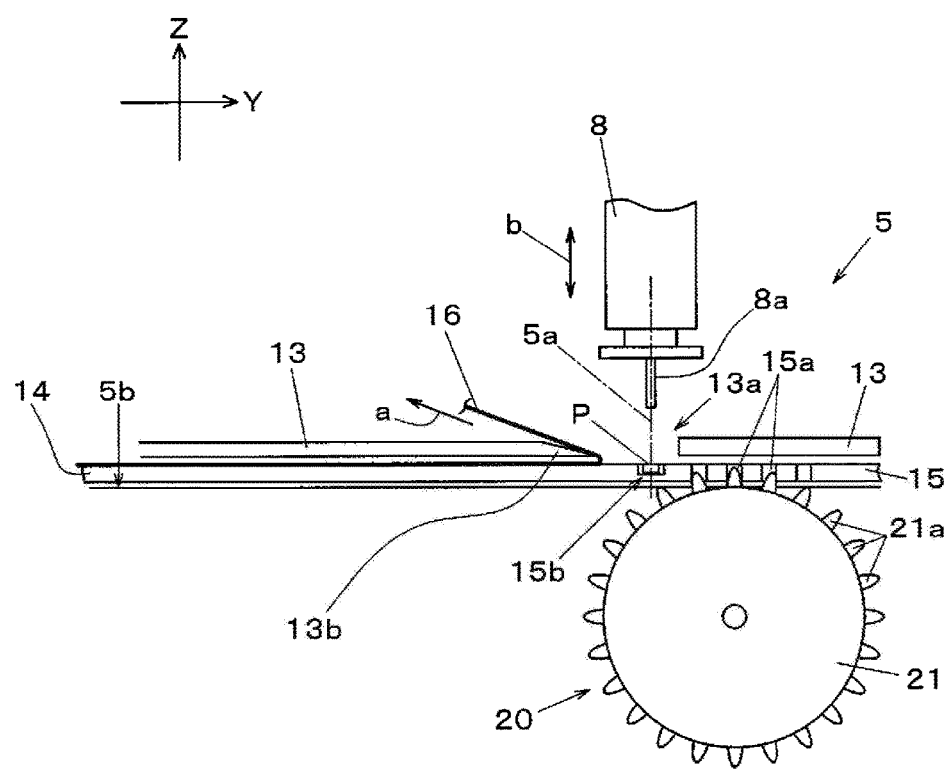
FIG. 2 is an explanatory diagram illustrating a component picking-up operation in a component mounting method of the embodiment of the present invention.

Next, a structure of a tape feeding mechanism and a pitch feeding operation will be described with reference to FIG. 2. FIG. 2 is a partial sectional view of the vicinity of the component picking-up position 5a of the tape feeder 5. A tape traveling path 5b is provided in the tape feeder 5 and a carrier tape 14 is fed to the downstream side (right side in FIG. 2) along an upper surface of the tape traveling path 5b. The carrier tape 14 has a configuration (refer to FIG. 4A) in which a cover tape 16 adheres to a base tape 15 in which a recessed pocket 15b for accommodating the component in which the component P is accommodated and a sprocket hole 15a are provided and the cover tape 16 covers the upper surface of the pocket 15b.

A tape feeding mechanism 20, which includes a rotational drive mechanism (not illustrated) with a tape feeding motor as a drive source and a sprocket 21, is provided on the end side downstream of the tape feeder 5. The sprocket pin 21a is provided in the sprocket 21 and engages with the sprocket hole 15a provided on the base tape 15 at regular pitches. The rotational drive mechanism rotates and drives the sprocket 21 and the tape feeding drive force is transmitted to the sprocket hole 15a by the sprocket pin 21a, and the carrier tape 14 is fed to the downstream side. Thus, the sprocket 21 is caused to intermittently rotate, and thereby the carrier tape is fed at predetermined pitch.

In the vicinity of the tape feeder 5, the upper surface of the carrier tape 14 on the tape traveling path 5b is covered by a pressing member 13 which has a function of guiding the carrier tape 14 from the upper surface side thereof. An opening 13a through which the suction nozzle 8a picks up the component P at the component picking-up position 5a, is provided in the pressing member 13 and an end of the opening 13a on the upstream side becomes a peeling unit 13b for peeling the cover tape 16.

When the carrier tape 14 which is fed on the tape traveling path 5b reaches the opening 13a, the cover tape 16 of the carrier tape 14 is pulled off from the base tape 15 and is folded back in a direction (arrow a) opposite to the tape feeding direction by the peeling unit 13b. In this manner, the upper surface of the pocket 15b is exposed in the base tape 15. In this state, the suction nozzle 8a is lifted and lowered (arrow b) with respect to the pocket 15b which is fed to the component picking-up position 5a and is stopped and thereby the component P is picked up by the mounting head 8 through vacuum suction.

In the peeling operation of the cover tape 16 described above, tension acts on the cover tape 16 in an arrow a direction. In the base tape 15, in addition to a tape feeding drive force by the tape feeding mechanism 20, a tape feeding force acts on the base tape 15 and feeds the base tape 15 to the downstream side by tension of the cover tape 16. Since the tension acting on the cover tape 16 folded back at the pocket 15b is not necessarily constant, in many cases, the tape feeding force which is applied to and acts on the base tape 15 in response to the peeling of the cover tape 16 become instable and thus, causes variation as one factor in the stop position of the pocket 15b at the component picking-up position 5a.

Figure 3A:
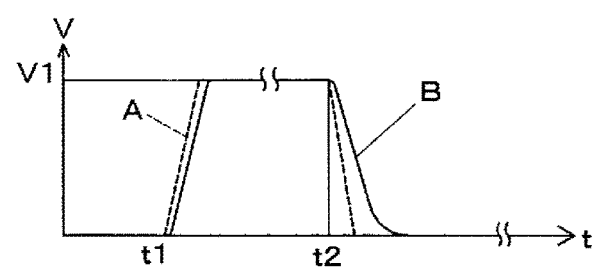
FIGS. 3A to 3C are graphs illustrating speed patterns of a pitch feeding speed of a carrier tape in the component mounting method of the embodiment of the present invention.

Here, a speed pattern showing a time change of a tape feeding speed V in one pitch feeding operation of the tape feeding of the carrier tape 14 in the tape feeding mechanism 20 will be described with reference to FIGS. 3A to 3C. First, FIG. 3A illustrates a theoretical speed pattern A (illustrated by a dotted line) in design data based on a drive instruction in the one pitch operation and an actual moving speed pattern B (illustrated by a solid line) corresponding to an actual feeding operation when the carrier tape 14 is fed by pitch in the tape feeder 5.

That is, a pitch feeding start instruction is output at a timing t1 and a trapezoidal speed pattern (theoretical speed pattern A in the design data) for which the maximum speed V1 is a target is output. The tape feeding motor starts to be driven in accordance with the speed pattern. However, in the actual tape feeding of the carrier tape 14 by the tape feeding mechanism 20, a feeding speed at which the carrier tape 14 is fed does not always follow the entire theoretical speed pattern A according to a balance between the drive force of the rotational drive mechanism (rated torque of the tape feeding motor) and a drive load for feeding the carrier tape 14 by the tape feeding mechanism 20 and the tape feeding is performed in a speed pattern similar to the actual moving speed pattern B.

In general, in a case where the drive load is excessively greater than the drive force, acceleration is performed to be slightly more delayed than the theoretical speed pattern A in an accelerating process to reach the maximum speed V1. After pitch feeding stop instruction is output at a timing t2, since inertia of the drive load is greater than the drive force of the rotational drive mechanism (braking force in a case of pitch feeding stop), the pitch feeding is stopped in a state in which the stop position instructed by the theoretical speed pattern A is slightly shifted. In this case, a shift amount of a stop position shift of the carrier tape 14 is not constant by a balance between the drive force and the drive load. Further, as described above, in a case where the action of the tension is applied by the cover tape 16, the change in the position shift is further complicated and thus, it is difficult to predict a degree of the variations in the shift amount.

Since the variations of the stop position in the pitch feeding of the carrier tape 14 has a great influence on erroneous suction by the suction nozzle 8a, according to the present embodiment, as will be described below, a timing of the pitch feeding, that is, after a predetermined delay time TD elapses after the timing t2 at which the pitch feeding stop instruction in a control instruction, the suction nozzle 8a performs suction and holding of the component P and picks up the component P from the pocket 15b in a state in which the tape feeding is stopped.

Figure 3B:
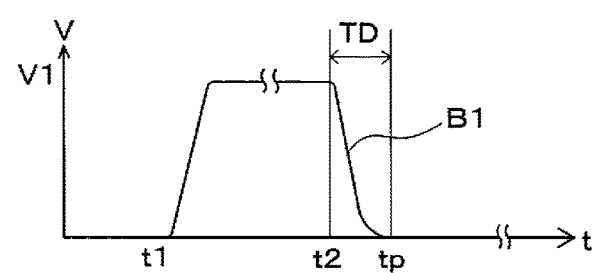

In FIG. 3B, the actual moving speed pattern B1 of the carrier tape 14 as a target has a good degree of following of the theoretical speed pattern A, and the tape feeding of the carrier tape 14 is completely stopped at a component suction timing tp after a predetermined delay time TD set as the initial value in advance elapses after the timing t2. Therefore, it is possible to pick up the component P from the pocket 15b of the carrier tape 14 in a state in which the suction nozzle 8a is completely stopped.

Figure 3C:
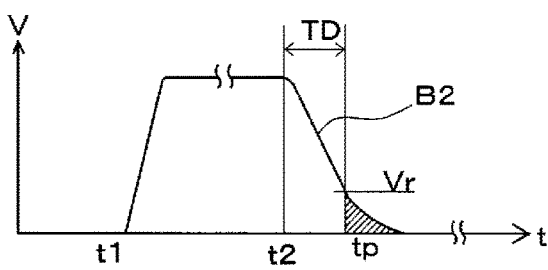

In comparison, FIG. 3C illustrates an example of a case in which the drive load becomes great such as the carrier tape 14 as a target accommodating a large-sized component and the actual moving speed pattern B2 of the carrier tape 14 has a degree of following which is likely to be delayed with respect to the theoretical speed pattern A. In this case, at a component suction timing tp after the predetermined delay time TD set as the initial value in advance elapses after the timing t2, the tape feeding of the carrier tape 14 is not completely stopped and there is a residual speed Vr. Then, until the residual speed Vr becomes zero, the carrier tape 14 travels and a position shift occurs by an amount of a distance corresponding to an area of a hatched portion in the graph.

Therefore, even when the component suction operation is executed at the component suction time tp set based on the delay time TD in advance, the suction nozzle 8a is lowered to the carrier tape 14 which is not stopped and it is not possible to normally pick up the component P from the pocket 15b. In order to prevent such a problem, according to the present embodiment, in the tape feeding operation of the carrier tape 14, a tape position indicating portion is imaged a plurality of times, which is identified in advance as an indicating portion representing a position of the carrier tape 14 in the tape feeding direction at a timing after the delay time TD elapses. A shift amount of the tape position of the carrier tape 14 is obtained using the plurality of tape positions obtained by imaging, and thereby it is determined whether or not the carrier tape 14 is in a stopped state. In a case where the carrier tape 14 is not in a stopped state even after the delay time TD elapses, a process of extending the delay time TD set in advance is performed.

Figure 4A:
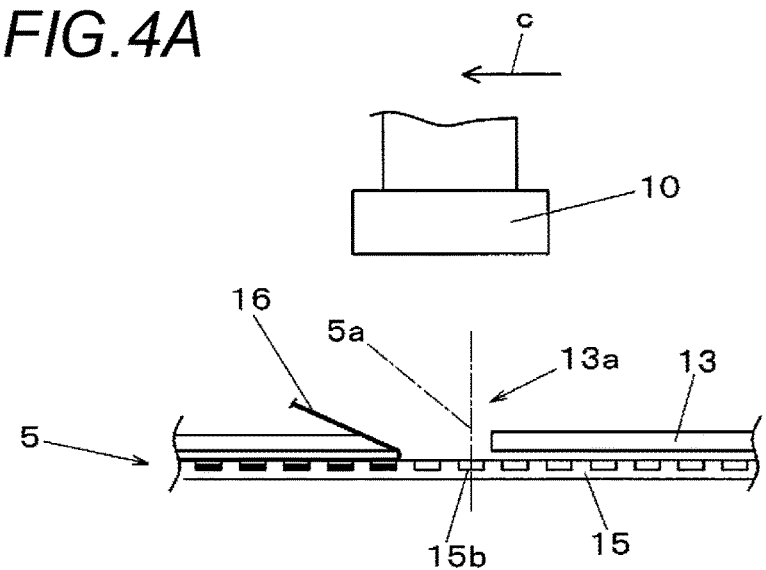
FIGS. 4A and 4B are explanatory diagrams of imaging and position detecting of a tape position indicating portion in the component mounting method of the embodiment of the present invention.

Next, a tape position indicating portion detecting process which is executed to achieve the above object will be described with reference to FIGS. 4A and 4B. FIG. 4A illustrates a state in which the board-recognition camera 10 is caused to move (arrow c) above the opening 13a. In this state, the board-recognition camera 10 images the vicinity of the opening 13a including the component picking-up position 5a.

Figure 4B:
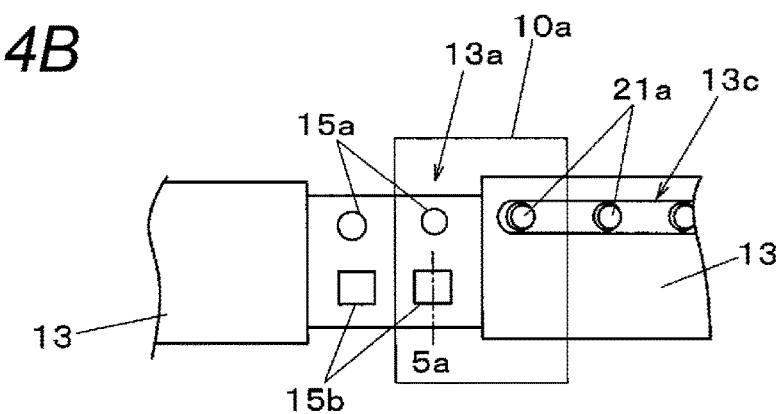

FIG. 4B illustrates a state in which the vicinity of the opening 13a is viewed from above. The sprocket hole 15a and the pocket 15b corresponding to the component picking-up position 5a are exposed inside the opening 13a. A relief opening 13c for preventing interference with a tip of the sprocket pin 21a is provided in the pressing member 13 on the downstream side. An imaging position of the board-recognition camera 10 is appropriately set at a portion above the pressing member 13, and thereby it is possible to position the sprocket hole 15a, the pocket 15b corresponding to the component picking-up position 5a, and the tip of the sprocket pin 21a in the vicinity of the component picking-up position 5a within a recognition screen 10a of the board-recognition camera 10.

Figure 5:
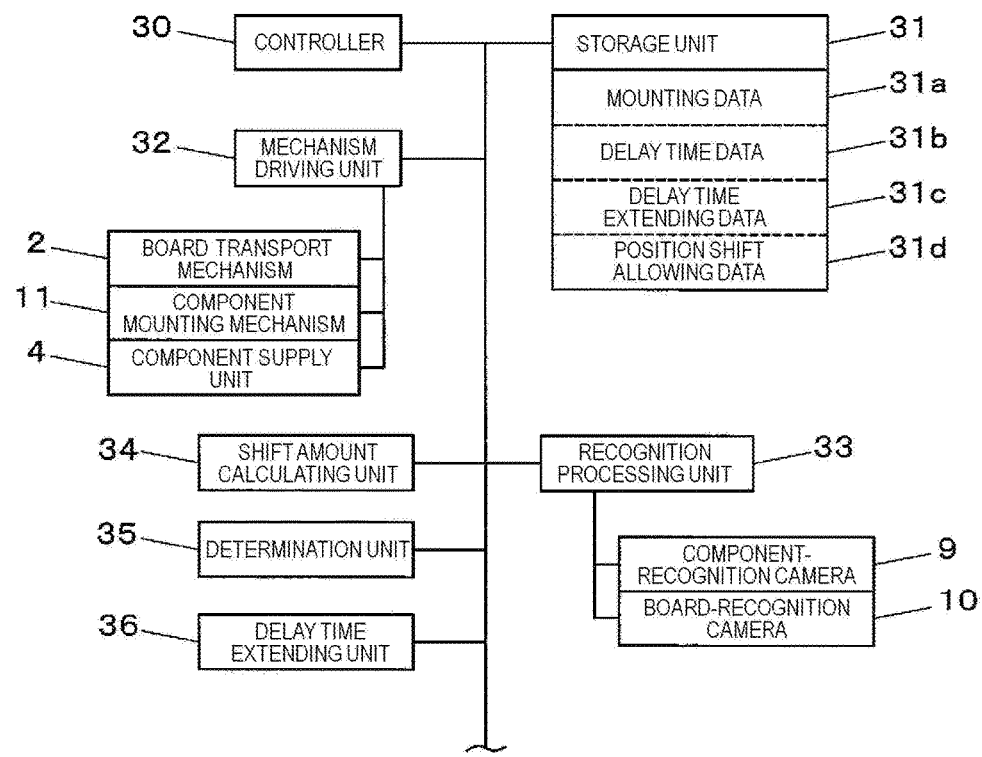
FIG. 5 is a block diagram illustrating a configuration of a control system of a component mounting apparatus of Embodiment 1 of the present invention.

Next, a configuration of the control system of the component mounting apparatus 1 will be described with reference to FIG. 5. In FIG. 5, the component mounting apparatus 1 includes a controller 30, a storage unit 31, a mechanism driving unit 32, a recognition processing unit 33, a shift amount calculating unit 34, a determination unit 35, and a delay time extending unit 36. The controller 30 is a CPU having processing and arithmetic functions, executes various programs (not illustrated) stored in the storage unit 31, and thereby controls the following units. Mounting data 31a, delay time data 31b, delay time extending data 31c, and position shift allowing data 31d stored in the storage unit 31 are referred to during the control process.

The mounting data 31a means data representing component data of the component as a mounting target or mounting coordinate data in the board 3. The delay time data 31b means data related to the delay time TD described in FIG. 3B and is individually set for each type of component (type of tape). As illustrated in FIG. 3B, the delay time extending data 31c means various types of data which needs to execute a process of extending the delay time TD, that is, data related to an additionally delayed time or the like which is added and applied in order to extend the delay time TD set in advance. The position shift allowing data 31d means data defining an allowable value of a shift amount of the tape position in order to determine whether or not the carrier tape 14 is in a stopped state to the extent that there is no interference with the picking up by the suction nozzle 8a.

The mechanism driving unit 32 is controlled by the controller 30 and drives the component mounting apparatus 1, the component mounting mechanism 11, and the tape feeder 5 of the component supply unit 4. The drive mechanisms are driven based on the mounting data 31a, and thereby the component mounting operation to carry and mount the component P on the positioned board 3 and the component supply operation to supply the component P by the tape feeder 5 in the component mounting operation are executed.

Figure 6A:
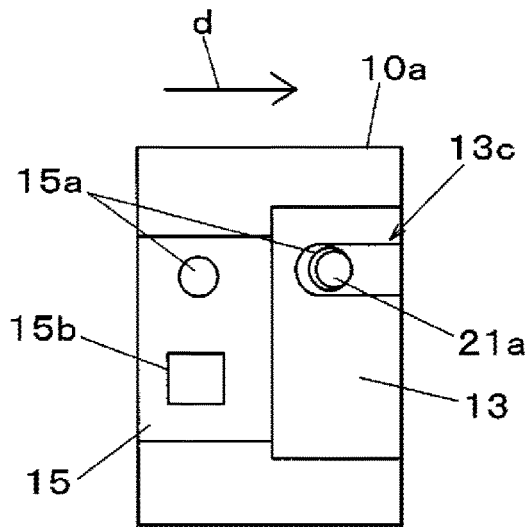
FIGS. 6A to 6D are explanatory diagrams illustrating a position detecting process of the tape position indicating portion in the component mounting method of Embodiment 1 of the present invention.

The recognition processing unit 33 performs a recognition process of an imaging result by the component-recognition camera 9 and the board-recognition camera 10. The vicinity of the opening 13a is imaged by the board-recognition camera 10, and thereby as illustrated on the recognition screen 10a in FIG. 6A, it is possible to image the sprocket hole 15a, the pocket 15b corresponding to the component picking-up position 5a, and the tip of the sprocket pin 21a which is exposed within the relief opening 13c in the vicinity of the component picking-up position 5a. These corresponds to tape position indicating portions set to identify the tape position representing a position of the carrier tape 14 in the tape feeding direction (arrow d) and the board-recognition camera 10 corresponds to an imaging unit that images the tape position indicating portions.

The shift amount calculating unit 34 performs a process of calculating a shift amount of a tape position indicating portion imaged by the recognition processing unit 33. That is, a shift amount between a first tape position obtained by imaging the tape position indicating portion by the board-recognition camera 10 as an imaging unit at the timing after the delay time TD elapses after the timing (timing t2) of the pitch feeding; and a second tape position obtained by again imaging the tape position indicating portion thereafter is calculated. The determination unit 35 determines whether or not the shift amount calculated by the shift amount calculating unit 34 is within the allowable range. The delay time extending unit 36 extends the delay time in a case where the shift amount calculated by the shift amount calculating unit 34 is not within the allowable range.

Figure 6B:
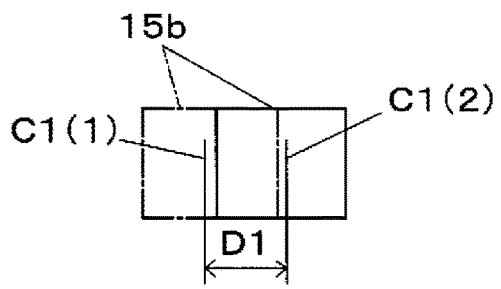
Figure 6C:
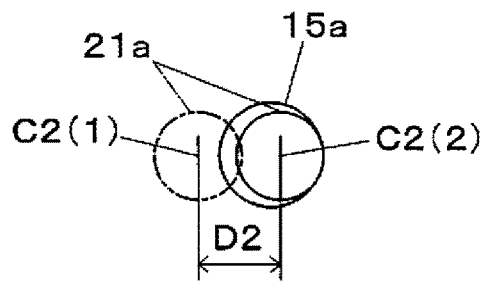
Figure 6D:
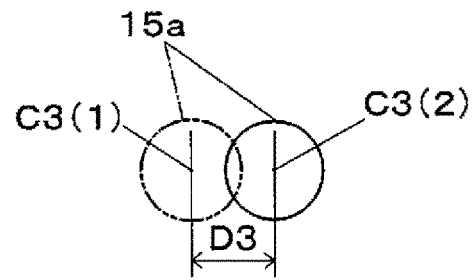

Here, as the tape position indicating portion, as illustrated in FIGS. 6B, 6C, and 6D, it is possible to use any one of the pocket 15b, the sprocket pin 21a in a state of engaging with the sprocket hole 15a, or the sprocket hole 15a itself. In the example illustrated in FIG. 6B, a gap between the central point C1 (1) (first tape position) of the pocket 15b obtained by imaging the pocket 15b corresponding to the tape position indicating portion at the timing after the delay time TD elapses and the central point C1 (2) (second tape position) of the pocket 15b obtained by again imaging the pocket 15b thereafter is a shift amount D1.

In the example illustrated in FIG. 6C, a gap between the central point C2 (1) (first tape position) of the sprocket pin 21a obtained by imaging the sprocket pin 21a in a state of engaging with the sprocket hole 15a at the timing after the delay time TD elapses and the central point C2 (2) (second tape position) of the sprocket pin 21a obtained by again imaging the sprocket pin 21a thereafter is a shift amount D2. Further, in the example illustrated in FIG. 6D, a gap between the central point C3 (1) (first tape position) of the sprocket hole 15a obtained by imaging the sprocket hole 15a itself at the timing after the delay time TD elapses and the central point C3 (2) (second tape position) of the sprocket hole 15a obtained by again imaging the sprocket hole 15a thereafter is a shift amount D3.

Next, an unstable component-supplying feeder detecting process of detecting a tape feeder which performs unstable component supply will be described with reference to FIG. 7 and FIGS. 8A and 8B. According to the present embodiment, the unstable component-supplying feeder detecting process is executed during a suction position automatic-teaching process of automatically set a component suction position by the mounting head 8 based on an image recognition result from imaging the vicinity of the opening 13a by the board-recognition camera 10.

Since the suction position automatic-teaching process is performed in a case where a production lot is replaced such that types of components or tapes as a production targets are changed or when a pre-mounted carrier tape is switched to a new carrier tape supplied using splicing, a change in the delay time TD described above, such as extension deformation progress of the drive load or the tape itself for tape feeding, is predicted. Thus, both the suction position automatic-teaching process and the unstable component-supplying feeder detecting process are performed together, and thereby it is possible to prevent erroneous suction due to the unstable component supply and thus it is possible to prevent the productivity from deteriorating.

Figure 7:
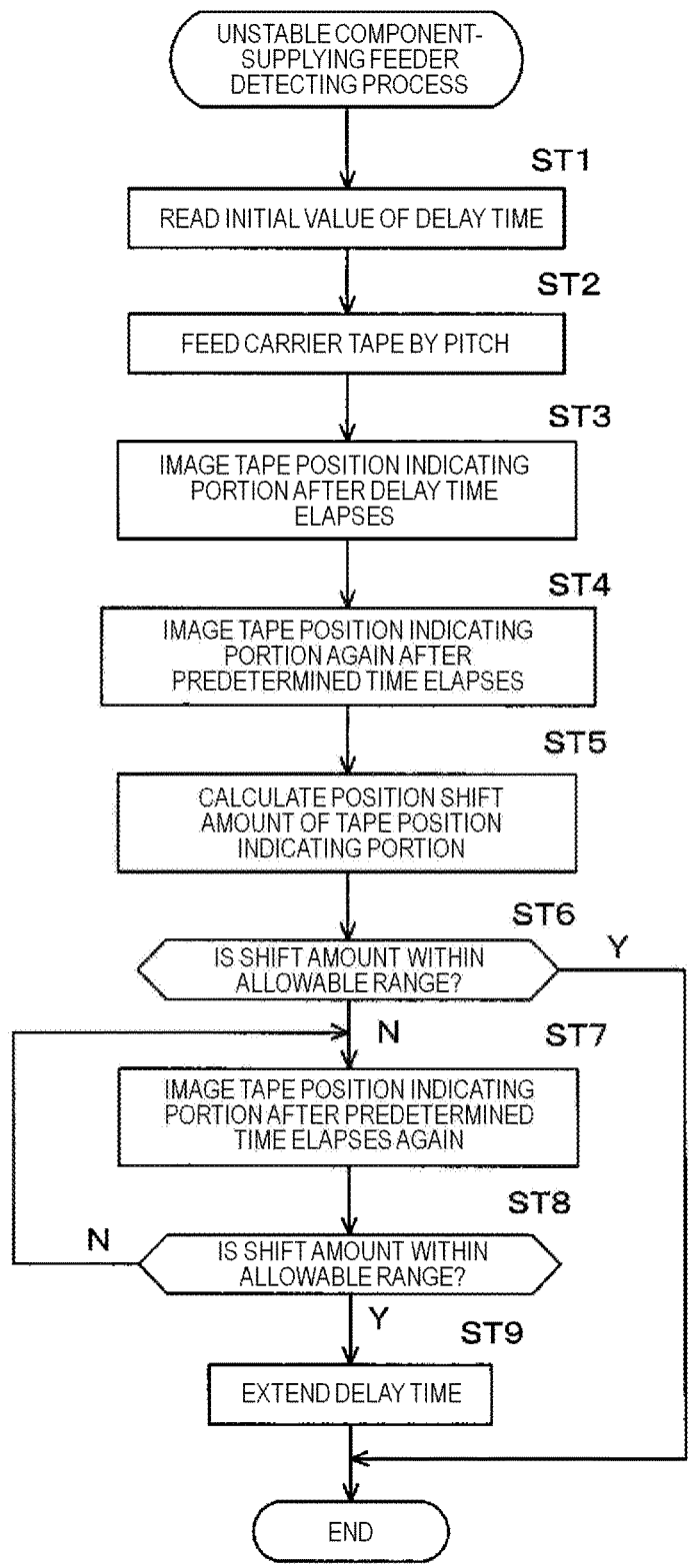
FIG. 7 is a flowchart of a component mounting operation in the component mounting method of Embodiment 1 of the present invention.

In FIG. 7, when the unstable component-supplying feeder detecting process is started, first, reading of an initial value TD0 of the delay time TD is performed (ST1). In this manner, the initial value TD0 which is stored corresponding to a type of component is read from the delay time data 31b which is stored in the storage unit 31. Next, in the component supply unit 4 of the component mounting apparatus 1, the tape feeder 5 as a target of the unstable component-supplying feeder detecting process feeds the carrier tape 14 by pitch (ST2).

Figure 8A:
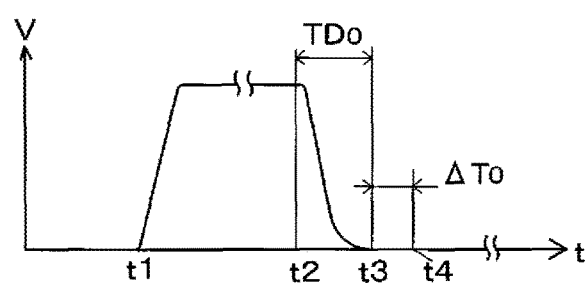
FIGS. 8A and 8B are graphs illustrating a relationship between a speed pattern of a pitch feeding speed of a carrier tape and a tape position detecting timing according to Embodiment 1 of the present invention.

FIG. 8A illustrates a speed pattern in the tape feeding direction at the tape position indicating portion (any one of the pocket 15b, the sprocket pin 21a, or the sprocket hole 15a may be used) in the pitch feeding. Next, the board-recognition camera 10 is caused to move above the vicinity of the opening 13a and the tape position indicating portion is imaged by the board-recognition camera 10 at a timing t3 after the initial value TD0 of the delay time elapses after the timing t2 as a timing of the pitch feeding in the speed pattern illustrated in FIG. 8A (ST3). Then, the tape position indicating portion is again imaged by the board-recognition camera 10 at a timing t4 after an added time ΔT0 as a predetermined time elapses (ST4).

Then, the imaging result is subjected to the recognition process by the recognition processing unit 33 and a shift amount between a position of the tape position indicating portion in (ST3) and a position of the tape position indicating portion in (ST4) is calculated (ST5) based on the recognition result. That is, any one of the shift amounts D1, D2, and D3 illustrated in FIGS. 6B, 6C, and 6D is calculated by the shift amount calculating unit 34. Next, the determination unit 35 determines whether or not the calculated shift amount is within the allowable range (ST6). The determination is performed by the determination unit 35 comparing the shift amount to the position shift allowing data 31d stored in the storage unit 31. Here, in a case where it is determined that the calculated shift amount is within the allowable range, the movement amount of the tape position from the timing t3 to timing t4 is insignificant (in other words, the carrier tape 14 is already stopped at the timing t3) and thus, there is no problem for the suction nozzle 8a to perform the component suction.

Figure 8B:
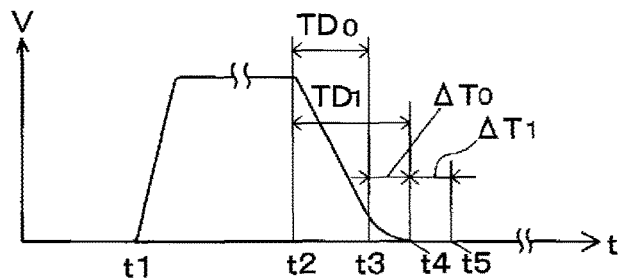

In comparison, in a case where it is determined that the shift amount calculated in (ST5) is not within the allowable range, as illustrated in FIG. 8B, a shift amount between a tape position indicating portion obtained by a imaging result of again imaging the tape position indicating portion by the board-recognition camera 10 at the timing t3 (timing after the initial value TD0 of the delay time elapses after the timing t2) and the tape position indicating portion obtained by an imaging result of again imaging at the timing t4 (timing after the initially added time ΔT0 elapses after the timing t3) exceeds the allowable range and thus, the carrier tape 14 has yet to stop at the timing t3.

In a case where the shift amount exceeds the allowable range, the tape position indicating portion is again imaged after a predetermined time elapses (ST7). That is, the tape position indicating portion is again imaged by the board-recognition camera 10 at a timing t5 after a first added time ΔT1 elapses after the timing t4. Then, the imaging result is subjected to the recognition process by the recognition processing unit 33, a shift amount between the position of the tape position indicating portion in (ST4) and a position of a tape position indicating portion in (ST7) is calculated, and the determination unit 35 determines (ST8) whether or not the calculated shift amount is within the allowable range.

Here, in a case where the calculated shift amount is within the allowable range, the carrier tape 14 is already stopped at the timing t4 and the delay time TD is extended to the first delay time TD1 (initial value TD0+initially added time ΔT0). In addition, in a case where it is determined that the shift amount in (ST8) exceeds the allowable range, the process returns to (ST7) and the same process is repetitively executed.

In the step configuration described above, the step of imaging the tape position indicating portion at the timing t3 by the board-recognition camera 10 corresponds to a first imaging step (ST3 in FIG. 7) in which the tape position indicating portion is imaged to identify the tape position of the carrier tape 14 in the tape feeding direction at the timing t3 after the delay time TD elapses after the timing t2 as the timing of the pitch feeding. The step of imaging the tape position indicating portion at the timing t4 by the board-recognition camera 10 corresponds to a second imaging step (ST4 in FIG. 7) of again imaging the tape position indicating portion after the first imaging step described above.

Embodiment 1 includes a shift amount calculating step of calculating the shift amount between the first tape position obtained by the imaging result in the first imaging step and the second tape position obtained by the imaging result in the second imaging step, a determination step of determining whether or not the shift amount calculated in the shift amount calculating step is within the allowable range, and a delay time extending step of extending the delay time set in the tape feeding in a case where it is determined, in the determination step, that the shift amount exceeds the allowable range.

According to Embodiment 1, an example is described, in which the added time for extending the delay time is common to an interval time (predetermined time) for again imaging in order to check the stop of the carrier tape 14; however, the added time and the interval time may be individually set.

Embodiment 2

Figure 9:
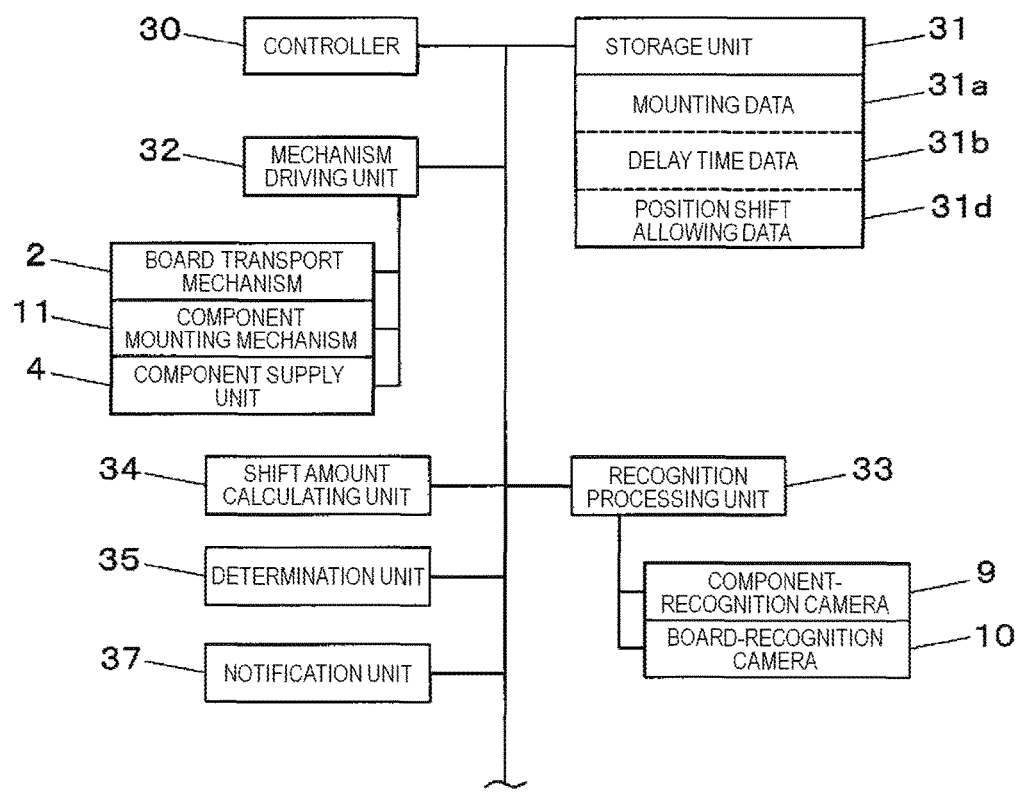
FIG. 9 is a block diagram illustrating a configuration of a control system of a component mounting apparatus of Embodiment 2 of the present invention.

FIG. 9 illustrates a configuration of a control system of the component mounting apparatus 1 of Embodiment 2. The configuration illustrated in FIG. 9 is different from that in FIG. 5 in that the delay time extending unit 36 and the delay time extending data 31c in the configuration of the control system of Embodiment 1 in FIG. 5 are removed and the notification unit 37 is added. Except that, the functions of each unit are the same as in FIG. 5. The notification unit 37 notifies an error in a case where the determination unit 35 determines that the shift amount exceeds the allowable range.

Figure 10:
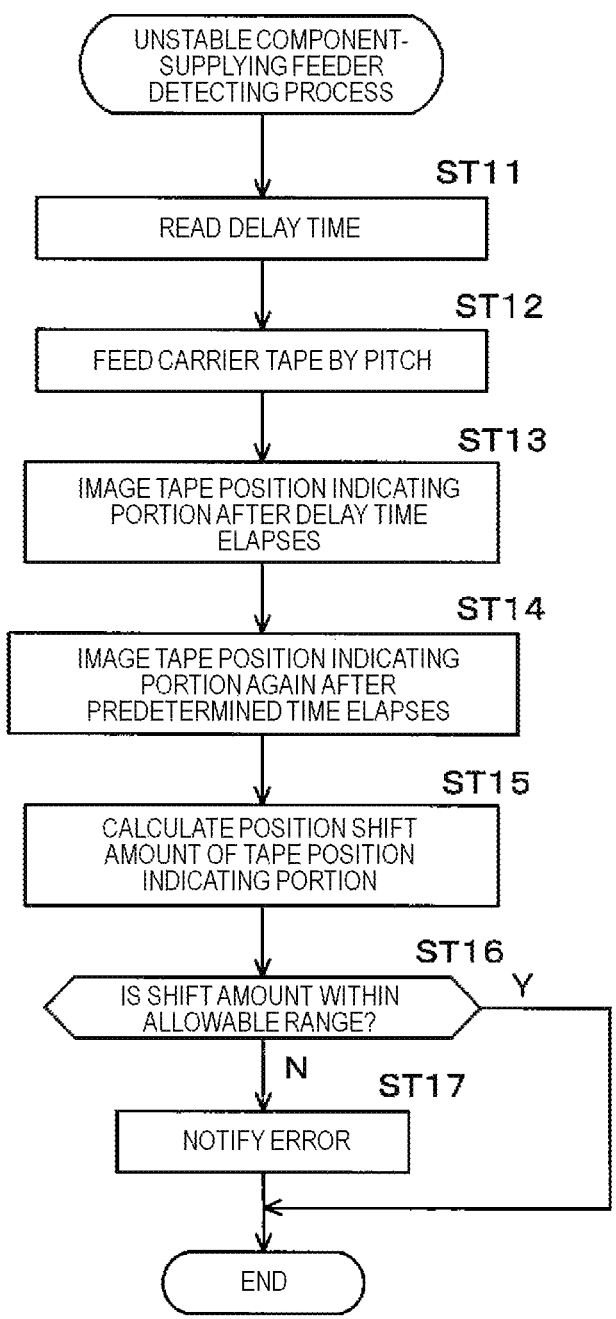
FIG. 10 is a flowchart of a component mounting operation in the component mounting method of Embodiment 2 of the present invention.

An unstable component-supplying feeder detecting process of detecting a tape feeding that performs an unstable component supply will be described with reference to FIG. 10. (ST11) to (ST16) in FIG. 10 correspond to (ST1) to (ST6) in FIG. 7. When the unstable component-supplying feeder detecting process is started, first, reading of the delay time TD is performed (ST11). In this manner, the delay time TD which is stored corresponding to a type of component is read from the delay time data 31b which is stored in the storage unit 31.

Figure 11A:
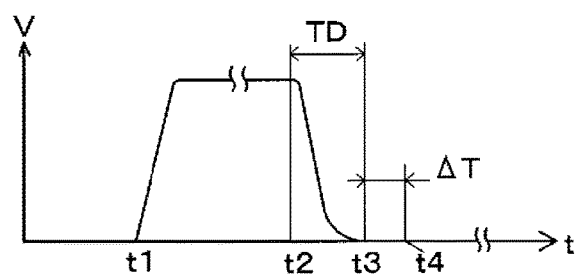
FIGS. 11A and 11B are graphs illustrating a relationship between a speed pattern of a pitch feeding speed of a carrier tape and a tape position detecting timing in the component mounting method of Embodiment 2 of the present invention.

Next, in the component supply unit 4 of the component mounting apparatus 1, the tape feeder 5 as a target of the unstable component-supplying feeder detecting process feeds the carrier tape 14 by pitch (ST12). FIG. 11A illustrates a speed pattern in the tape feeding direction at the tape position indicating portion in the pitch feeding. Next, the board-recognition camera 10 is caused to move above the vicinity of the opening 13a and the tape position indicating portion is imaged by the board-recognition camera 10 at a timing t3 after the delay time TD elapses after the timing t2 as a timing of the pitch feeding in the speed pattern illustrated in FIG. 11A (ST13). Then, the tape position indicating portion is again imaged by the board-recognition camera 10 at a timing t4 after an added time ΔT0 as a predetermined time elapses (ST14).

Then, the imaging result is subjected to the recognition process by the recognition processing unit 33 and a shift amount between a position of the tape position indicating portion in (ST13) and a position of the tape position indicating portion in (ST14) is calculated (ST15) based on the recognition result. That is, any one of the shift amounts D1, D2, and D3 illustrated in FIGS. 6B, 6C, and 6D is calculated by the shift amount calculating unit 34. Next, the determination unit 35 determines whether or not the calculated shift amount is within the allowable range (ST16). The determination is performed by the determination unit 35 comparing the shift amount to the position shift allowing data 31d stored in the storage unit 31.

Here, in a case where it is determined that the calculated shift amount is within the allowable range, the movement amount of the tape position from the timing t3 to timing t4 is insignificant (in other words, the carrier tape 14 is already stopped at the timing t3) and thus, there is no problem for the suction nozzle 8a to perform the component suction. Therefore, in this case, the process is ended as is.

Figure 11B:
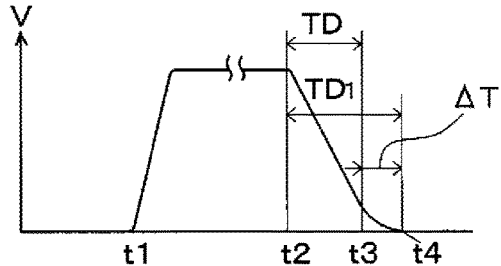

In comparison, in a case where it is determined that the shift amount calculated in (ST15) is not within the allowable range, as illustrated in FIG. 11B, a shift amount between a tape position indicating portion at the timing t3 (timing after the delay time DT elapses after the timing t2), the tape position indicating portion obtained by an imaging result of again imaging by the board-recognition camera 10, and the tape position indicating portion obtained by an imaging result of again imaging at the timing t4 (timing after the initially added time ΔT elapses after the timing t3) exceeds the allowable range and thus, the carrier tape 14 has yet to stop at the timing t3. In this case, it is determined that the tape feeder 5 is in a state in which the component suction is unstably performed and notification of an error is performed (ST17). Then, the process ends.

That is, Embodiment 2 includes a shift amount calculating step of calculating the shift amount between the first tape position obtained by the imaging result in the first imaging step and the second tape position obtained by the imaging result in the second imaging step, a determination step of determining whether or not the shift amount calculated in the shift amount calculating step is within the allowable range, and a notifying step of notifying an error in a case where it is determined that the shift amount exceeds the allowable range, in the determination step.

Employing the configurations described in Embodiment 1 and Embodiment 2 make it possible to prevent erroneous suction due to an unstable component supply from occurring such that it is possible to prevent productivity from being lowered in a case where the drive system for performing the tape feeding in the tape feeder 5 and the drive load of the carrier tape 14 as a target of the tape feeding are not matched, or in a case where the change in the stopping process of the carrier tape 14 is unstable due to a force or the like in the tape feeding direction, which acts on the carrier tape 14 during peeling off the cover tape 16.

A component mounting method and a component mounting apparatus of the present invention are effective in that it is possible to prevent erroneous suction due to an unstable component supply from occurring such that it is possible to prevent productivity from being lowered and are applicable to a field in which a component is picked up from a tape feeding and is mounted on a board.

What is claimed is:

1. A component mounting method of performing suction and holing, by a suction nozzle, of a component fed to a component picking-up position by a tape feeder which feeds by pitch a carrier tape having a pocket in which the component is accommodated, after a predetermined delay time elapses after a pitch feeding timing, and carrying and mounting the component on a board, the component mounting method comprising:
   a first imaging of imaging a tape position indicating portion for identifying a tape position in a tape feeding direction of the carrier tape at a timing after the delay time elapses;
   a second imaging of imaging the tape position indicating portion again after the first imaging;
   a shift amount calculating of calculating a shift amount between a first tape position obtained by an imaging result in the first imaging and a second tape position obtained by an imaging result in the second imaging;
   a determination of determining whether or not the shift amount calculated in the shift amount calculating is within an allowable range; and
   a delay time extending of extending the delay time set for the tape feeder in a case where it is determined that the shift amount exceeds the allowable range.

2. The component mounting method according to claim 1, wherein the tape feeder causes a sprocket, on which a sprocket pin that engages with a sprocket hole formed in the carrier tape, to intermittently rotate and thereby the pitch feeding is performed, and
   wherein the tape position indicating portion is one of the pocket or the sprocket pin.

* * * * *